(12) United States Patent
Strand et al.

(10) Patent No.: US 9,685,935 B2
(45) Date of Patent: Jun. 20, 2017

(54) TUNABLE TRANSMON CIRCUIT ASSEMBLY

(71) Applicants: Joel D. Strand, Ellicott City, MD (US); Aaron A. Pesetski, Gambrills, MD (US)

(72) Inventors: Joel D. Strand, Ellicott City, MD (US); Aaron A. Pesetski, Gambrills, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 86 days.

(21) Appl. No.: 14/485,129

(22) Filed: Sep. 12, 2014

(65) Prior Publication Data

US 2016/0079968 A1     Mar. 17, 2016

(51) Int. Cl.
*H03K 3/38* (2006.01)
*H03K 3/012* (2006.01)
(Continued)

(52) U.S. Cl.
CPC ............... *H03K 3/38* (2013.01); *B82Y 10/00* (2013.01); *G06N 99/002* (2013.01); *H01L 39/2493* (2013.01); *H03K 3/012* (2013.01)

(58) Field of Classification Search
CPC ...... G01R 13/00; G01R 13/342; G11C 11/00; G11C 11/44; H01L 39/00; H01L 39/2493;
(Continued)

(56) References Cited

U.S. PATENT DOCUMENTS

2015/0349780 A1\* 12/2015 Naaman ............. H03K 19/1958
326/5

FOREIGN PATENT DOCUMENTS

| WO | 03090162 A2 | 10/2003 |
|---|---|---|
| WO | 2008089067 A1 | 7/2008 |
| WO | 2010028183 A2 | 3/2010 |

OTHER PUBLICATIONS

Koch, et al.: "Charge-Insensitive Qubit Design Derived from the Cooper Pair Box"; Physical Review a (Atomic, Molecular, and Optical Physics), American Physical Society, USA, vol. 76, No. 4, Oct. 12, 2007, pp. 42319-1-19, XP002743747, ISSN: 1050-2947, DOI: 10.1103/Physreva.76.042319; Figure 1.

(Continued)

*Primary Examiner* — Lincoln Donovan
*Assistant Examiner* — David Mattison
(74) *Attorney, Agent, or Firm* — Tarolli, Sundheim, Covell & Tummino LLP

(57) ABSTRACT

Systems and methods are provided for a tunable transmon qubit. The qubit includes a first Josephson junction on a first path between a transmission line and a circuit ground and second and third Josephson junctions arranged in parallel with one another on a second path between the transmission line and the circuit ground to form a direct current superconducting quantum interference device (DC SQUID). The DC SQUID is in parallel with the first Josephson junction. A capacitor is arranged in parallel with the first Josephson junction and the DC SQUID on a third path between the transmission line and the circuit ground as to form, in combination with the first path, an outer loop of the tunable transmon qubit. A bias circuit is configured to provide a constant bias flux to one of the DC SQUID and the outer loop of the tunable transmon qubit.

19 Claims, 5 Drawing Sheets

(51) Int. Cl.
*B82Y 10/00* (2011.01)
*H01L 39/24* (2006.01)
*G06N 99/00* (2010.01)

(58) Field of Classification Search
CPC ........ H03K 17/00; H03K 17/92; H03K 19/00;
H03K 19/1952; H03K 3/00; H03K 3/012;
H03K 3/38
USPC ........................................................ 327/367
See application file for complete search history.

(56) References Cited

OTHER PUBLICATIONS

D'Arrigo, et al.: "Optimal Operating Conditions of an Entangling Two-Transmon Gate"; New Journal ofPhysics Deutsche Physikalische Gesellschaft UK, vol. 14, No. 5, May 2012, pp. 53035/1-11, XP020222599; ISSN: 1367-2630; Figure 1.
International Search Report for corresponding PCT/US2015/046564, mailed Feb. 1, 2016.

* cited by examiner

TUNABLE TRANSMON CIRCUIT ASSEMBLY

TECHNICAL FIELD

This application relates generally to quantum circuits, and more specifically, to a tunable transmon circuit assembly.

BACKGROUND

A classical computer operates by processing binary bits of information that change state according to the laws of classical physics. These information bits can be modified by using simple logic gates such as AND and OR gates. The binary bits are physically created by a high or a low energy level occurring at the output of the logic gate to represent either a logical one (e.g. high voltage) or a logical zero (e.g. low voltage). A classical algorithm, such as one that multiplies two integers, can be decomposed into a long string of these simple logic gates. Like a classical computer, a quantum computer also has bits and gates formed by circuit assemblies. Instead of using logical ones and zeroes, a quantum bit ("qubit") uses quantum mechanics to occupy both possibilities simultaneously. This ability means that a quantum computer can solve a large class of problems with exponentially greater efficiency than that of a classical computer.

SUMMARY

In accordance with one example, a tunable transmon qubit is provided. The qubit includes a first Josephson junction on a first path between a transmission line and a circuit ground and second and third Josephson junctions arranged in parallel with one another on a second path between the transmission line and the circuit ground to form a direct current superconducting quantum interference device (DC SQUID). The DC SQUID is in parallel with the first Josephson junction. A capacitor is arranged in parallel with the first Josephson junction and the DC SQUID on a third path between the transmission line and the circuit ground as to form, in combination with the first path, an outer loop of the tunable transmon qubit. A bias circuit is configured to provide a constant bias flux to the DC SQUID and the outer loop of the tunable transmon qubit.

In accordance with another example, a method is provided for constructing a tunable transmon qubit. A transmon qubit is fabricated to include a first Josephson junction on a first path between a transmission line and a circuit ground, second and third Josephson junctions arranged in parallel with one another on a second path between the transmission line and the circuit ground to form a direct current superconducting quantum interference device (DC SQUID) in parallel with the first Josephson junction, and a capacitor in parallel with the first Josephson junction and the DC SQUID on a third path between the transmission line and the circuit ground as to form, in combination with the first path, an outer loop of the transmon qubit. A frequency curve of the transmon qubit is determined. A constant bias flux is provided to the DC SQUID and the outer loop of the transmon qubit to adjust a frequency curve of the transmon qubit. The frequency curve represents a frequency of a first energy level transition as a function of a control flux.

In accordance with yet another example, a tunable transmon qubit is provided. The qubit includes a first Josephson junction on a first path between a transmission line and a circuit ground and second and third Josephson junctions arranged in parallel with one another on a second path between the transmission line and the circuit ground to form a direct current superconducting quantum interference device (DC SQUID). The DC SQUID is in parallel with the first Josephson junction. A capacitor is arranged in parallel with the first Josephson junction and the DC SQUID on a third path between the transmission line and the circuit ground as to form, in combination with the first path, an outer loop of the tunable transmon qubit. A bias circuit is configured to provide a first constant bias flux to the DC SQUID and a second constant bias flux to the outer loop of the tunable transmon qubit.

BRIEF DESCRIPTION OF THE DRAWINGS

The features, objects, and advantages of the hybrid qubit assembly will become more apparent from the detailed description set forth below when taken in conjunction with the drawings, wherein.

DETAILED DESCRIPTION

The transmon qubit is considered to be one of the most promising devices for a scalable quantum computing architecture because of its long coherence time. The transmon qubit operates within a so-called circuit QED architecture, where the qubit is coupled strongly to a high Q resonator that functions simultaneously as a coupling bus, a filter, and a readout device. The inventors have found that, in order to minimize power dissipation on chip, a single flux control digital-to-analog converter (DAC) can be used to control multiple qubits, rather than one DAC per qubit. This type of multiplexing requires the qubits to be virtually identical throughout the operating range to avoid introducing errors. Unfortunately, current fabrication techniques for qubit assemblies allow for minor variations in the inductance and capacitance, causing deviation from desired state transition frequencies. A typical threshold for errors in quantum algorithms is one part in ten thousand.

A tunable transmon qubit assembly is capable of adjustments to a frequency of the state transitions associated with the qubit. The tunable assembly allows for at least one state transition, such as the first energy level transition, that is, the between the ground state and the first excited state, to be tuned to a common frequency. Accordingly, multiple transmon qubits can be controlled by a single DAC, allowing for a significant savings in power dissipation. This capability opens the way to large-scale integration of transmon qubits with local, on chip digital control circuitry.

Figure 1:
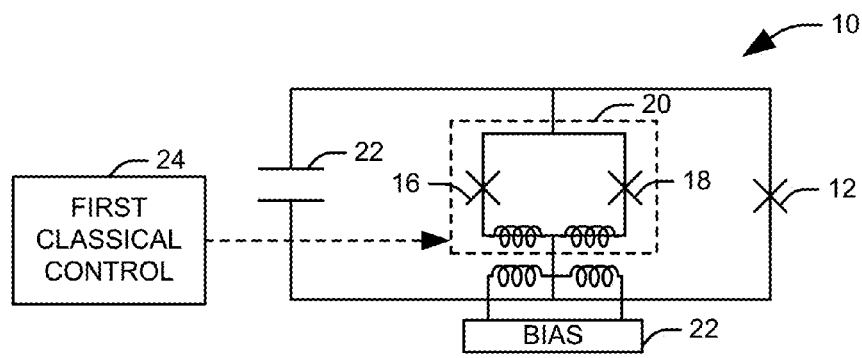
FIG. 1 illustrates a tunable transom qubit assembly.

FIG. 1 illustrates a tunable transmon qubit assembly. The illustrated tunable transmon assembly 10 includes a first Josephson junction 12, having an inductance $I_c$, on a first path between a transmission line and a circuit ground. It will be appreciated that the illustrated qubit is a modification of a split junction qubit, but in view of the teachings herein, one of skill in the art would be able to modify a three-junction transmon qubit, a hybrid transmon/flux qubit, as set forth in copending U.S. application Ser. No. 14/290,457, which is herein incorporated by reference, or any other transmon qubit design in a similar manner to provide a tunable transmon qubit. Second and third Josephson junctions 16 and 18 are arranged in parallel with one another on a second path between a transmission line and a circuit ground to form a direct current superconducting quantum interference device (DC SQUID) 20, each having a inductance $\alpha I_c$, where $\alpha$ is a number between zero and one referred to herein as an asymmetry of the qubit assembly 10. The DC SQUID is arranged in parallel with the first Josephson junction. A capacitor 22 is arranged in parallel with the first Josephson junction and the DC SQUID on a third path between a transmission line and a circuit ground.

The tunable transmon qubit assembly 10 includes a bias circuit 22 that applies a constant bias flux to one or both of the DC SQUID 20 and the outer loop formed by the first and third paths. In the illustrated implementation, the bias is applied to the DC SQUID 20, but one of skill in the art will appreciate that a similar bias could be applied to the outer loop of the qubit assembly 10 in a similar fashion, or as part of a control flux applied to the qubit assembly.

Figure 2:
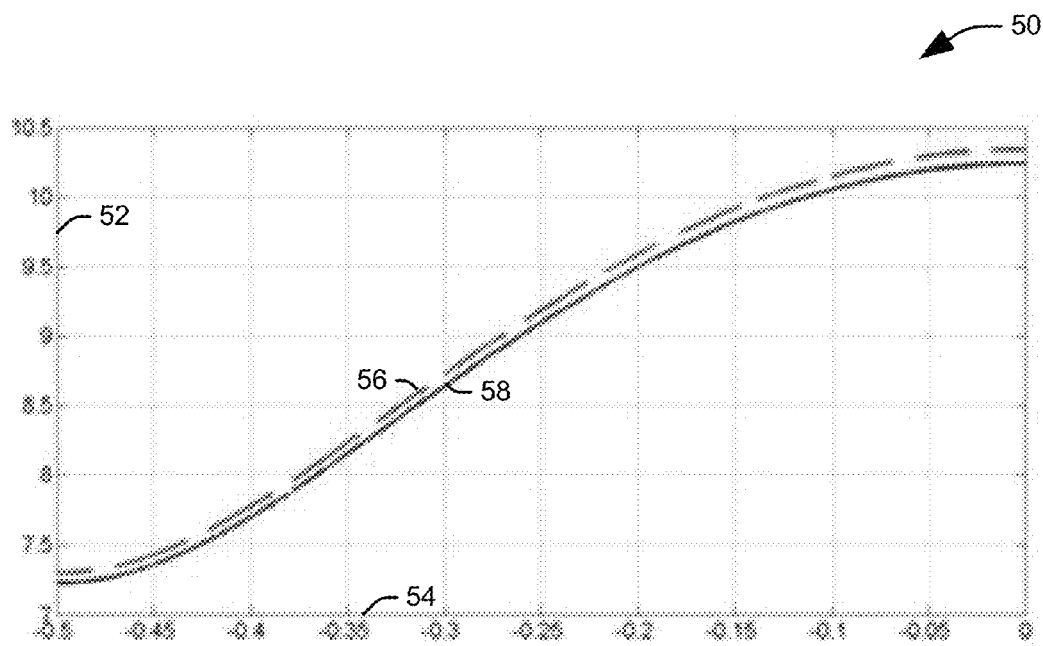
FIG. 2 is a chart of a frequency of a first energy level transition, represented in gigahertz on the vertical axis, against an applied control flux, represented on the horizontal axis and given in units of the magnetic flux quantum, for a first qubit and a second qubit.
Figure 3:
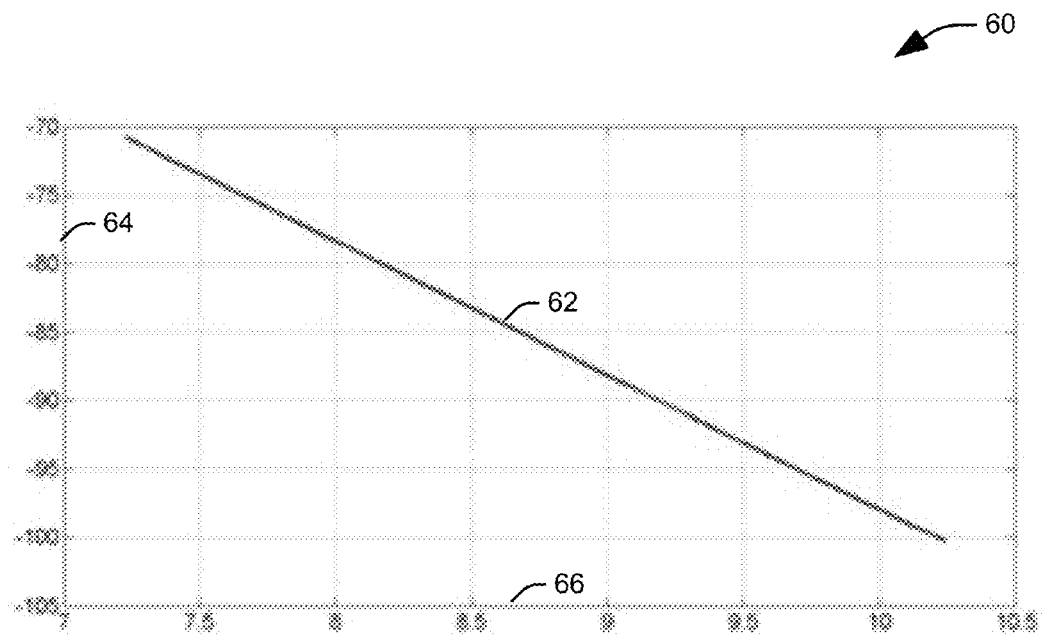
FIG. 3 is a chart of the difference in frequency of the first energy level transition between the first qubit and the second qubit in FIG. 2 across a frequency band.

The effects of the applied flux can best be understood with reference to FIGS. 2-5. FIG. 2 is a chart 50 of a frequency of a first energy level transition, represented in gigahertz on the vertical axis 52, against an applied control flux, represented on the vertical axis 54 and given in units of the magnetic flux quantum, $\Phi_0$, approximately equal to $2.068 \times 10^{-15}$ Webers for a first qubit and a second qubit. FIG. 3 is a chart 60 of the difference in frequency 62 of the first energy level transition between the first qubit and the second qubit in FIG. 2 across a frequency band. The vertical axis 64 represents the frequency difference in megahertz, and the horizontal axis 66 represents the first energy level transition frequency of the first qubit in gigahertz. It will be appreciated that the frequency curves of the first energy level transition for each of the first qubit 56 and the second qubit 58 differ in frequency across the entire range.

The frequency curves 56 and 58 have both a shape, defined as the peak-to-peak distance of the frequency curve. This is generally a function of the asymmetry, $\alpha$, between the critical currents of the Josephson junctions 16 and 18 in the DC SQUID and the critical current of the Josephson junction 12 in parallel with the DC SQUID. By adjusting the bias provided to the DC SQUID, the shape of the curve can be altered as to flatten or increase a curvature of the frequency curve. Effectively, deviations from a desired value of the asymmetry of the qubit can be accounted for through a constant bias, and it will be appreciated that a bias can be implemented without the use of a separate DAC. Similarly, by adjusting the bias provided to the outer loop of the qubit assembly, the first energy level transition can be changed in a substantially uniform manner across the frequency band, such that the frequency curve is effectively translated upward or downward. In other words, a substantially constant value is added or subtracted from the frequency of the first energy level transition across a broad range of control fluxes. This can adjust for deviations of a desired capacitance of the capacitor 22 or a critical current of the first Josephson junction 12.

Figure 4:
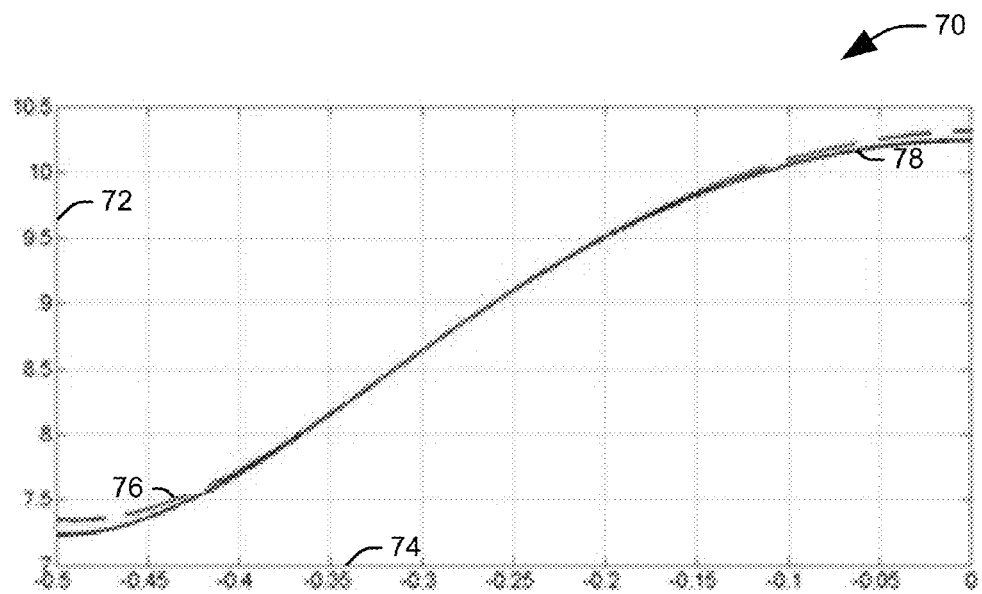
FIG. 4 is a chart of a frequency of the first energy level transition, represented in gigahertz on the vertical axis, against an applied control flux, represented on the horizontal axis and given in units of the magnetic flux quantum, $\Phi_0$, for the first qubit and a second qubit after a correcting bias has been applied to the first qubit.
Figure 5:
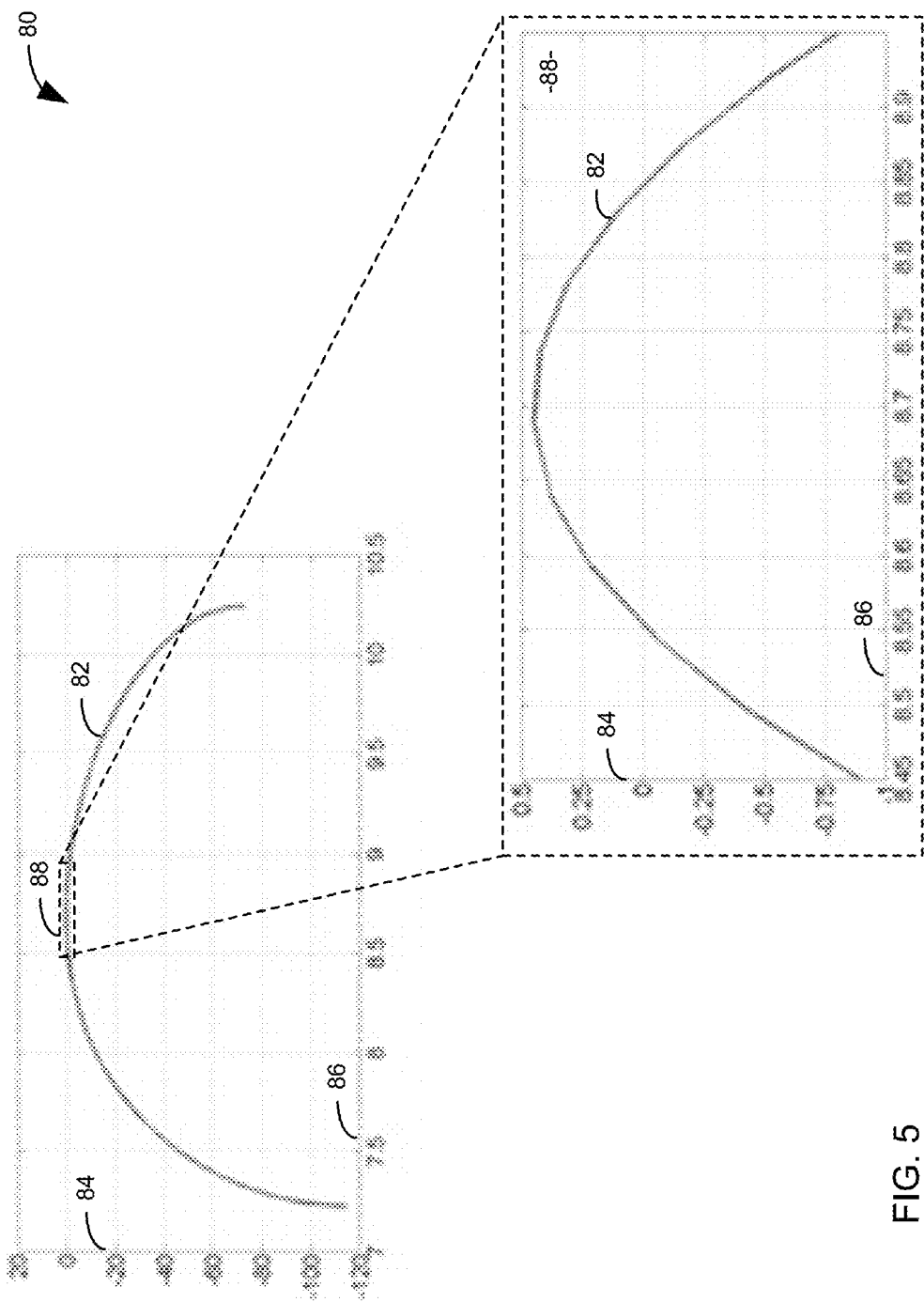
FIG. 5 is a chart of the difference in frequency of the first energy level transition between the first qubit and the second qubit across a frequency band after a correcting bias has been applied.

FIG. 4 is a chart 70 of a frequency of the first energy level transition, represented in gigahertz on the vertical axis 72, against an applied control flux, represented on the vertical axis 74 and given in units of the magnetic flux quantum, $\Phi_0$, for the first qubit and a second qubit after a correcting bias has been applied to the first qubit. It will be appreciated that the frequency curves for the two qubits have been brought into substantial alignment. FIG. 5 is a chart 80 of the difference 82 in frequency of the first energy level transition between the first qubit and the second qubit across a frequency band after a correcting bias has been applied. The vertical axis 84 represents the frequency difference in megahertz, and the horizontal axis 86 represents the first energy level transition frequency of the first qubit in gigahertz. It will be appreciated that the difference in the transition frequency of the qubits has been sharply reduced, particularly within a region of interest 88.

Figure 6:
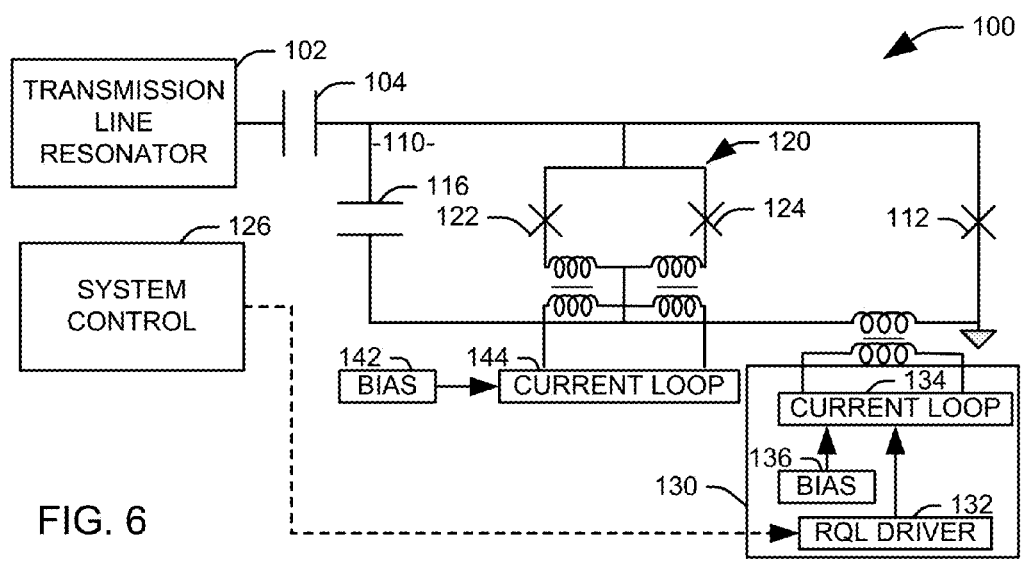
FIG. 6 illustrates one implementation of a quantum circuit.

FIG. 6 illustrates one implementation of a quantum circuit 100. The circuit 100 includes a transmission line resonator 102 coupled to a tunable transmon qubit assembly 110 through a coupling capacitor 104. The tunable transmon qubit assembly 110 includes three parallel paths, a first path with a first Josephson junction 112, a second path with a shunting capacitor 116, and a third path with a DC SQUID 120. The DC SQUID 120 is formed from two Josephson junctions 122 and 124 connected in parallel.

A system control 126 is operatively connected to a classical control 130, such that the system control can control a magnitude of a control flux provided to the tunable transmon qubit 110. The system control 126 can be implemented, for example, as dedicated hardware, software or firmware executed on a general purpose computer, or some combination of software and dedicated hardware. The classical control 130 is configured to provide flux to the qubit to transition the qubit among quantum states as to perform quantum operations. The first classical control 130 includes an RQL driver 132 and a first current loop 134 inductively coupled to an outer loop of the tunable quantum circuit assembly 110.

The classical control can further include a first bias element 136 that provides a first constant bias current to the first current loop 134. The first bias current can be provided to correct for deviations from a desired value of the capacitance of the capacitor 104 or a critical current of the first Josephson junction. It will be appreciated that the bias element can instead be provided independently to a third current loop (not shown) to provide a bias flux to the qubit 100. A second bias element 142 provides a second constant bias current to a second current loop 144 inductively coupled to the DC SQUID 120. The second bias current can be provided to correct for errors in a desired asymmetry of the qubit 110. Accordingly, the limitations of current fabrication methodologies can be overcome to provide a qubit having specifications suitable for control of multiple qubits via a single digital-to-analog converter.

Figure 7:
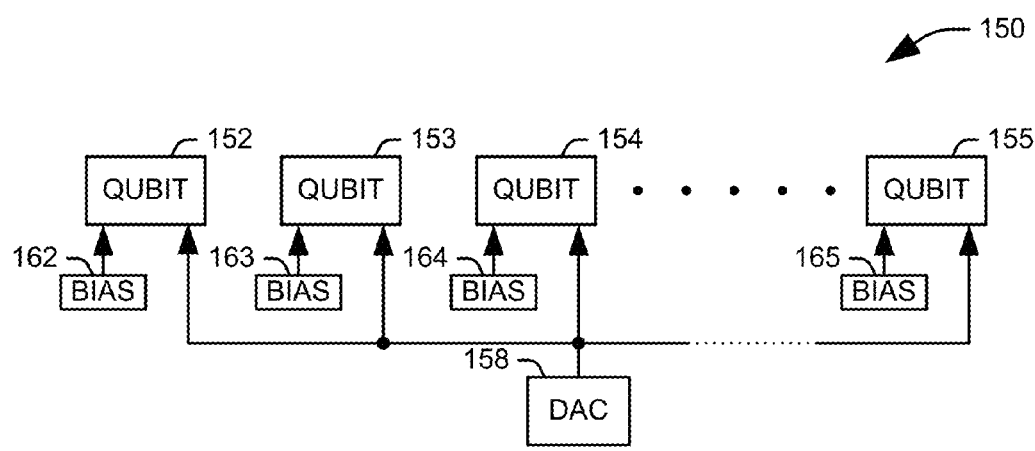
FIG. 7 illustrates one implementation of a quantum system using tunable transmon qubits.

FIG. 7 illustrates one implementation of a quantum system 150 using tunable transmon qubits. The system 150 includes a plurality of transmon qubit assemblies 152-155, for example, as illustrated in FIG. 6, all provided with a common control flux. In the illustrated implementation, each of the transmon qubit assemblies includes a classical control assembly with an RQL driver providing current to a current loop inductively coupled to the tunable transmon qubit. The RQL drivers associated with the plurality of transmon qubit assemblies are operatively connected to a common digital-to-analog converter (DAC) 158 that provides a control signal to the RQL drivers to provide a control flux to the qubits. It will be appreciated that by controlling multiple qubits with a single DAC, significant savings in power dissipation can be achieved.

The inventors have determined that, given fabrication technologies for quantum circuits, it is not currently feasible to create qubit assemblies to design standard sufficiently precise for common control of multiple assemblies. Specifically, minor variations in the inductance and capacitance, causing deviation from desired state transition frequencies. Accordingly, each qubit assembly 152-155 has an associated bias circuit 162-165 configured to provide a bias flux to its associated assembly as to adjust the frequency curve of the qubit to a desired standard for a frequency band of interest. Each bias circuit 162-165 can be configured to provide current to a current loop inductively coupled to the tunable transmon qubit. Through use of the bias circuits, large-scale integration of transmon qubits with local, on chip digital control circuitry can be facilitated.

Figure 8:
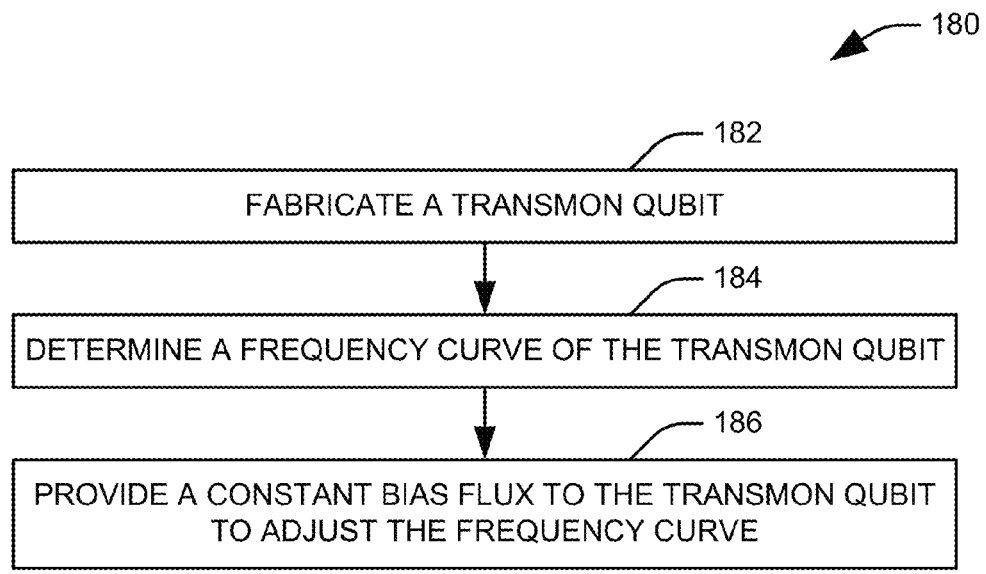
FIG. 8 illustrates an example of a method 180 for constructing a tunable transmon qubit.

In view of the foregoing structural and functional features described above, a methodology will be better appreciated with reference to FIG. 8. While, for purposes of simplicity of explanation, the methodology of FIG. 8 is shown and described as executing serially, it is to be understood and appreciated that the present invention is not limited by the illustrated order, as some aspects could occur in different orders and/or concurrently with other aspects from that shown and described herein. Moreover, not all illustrated features may be required to implement the methodology.

FIG. 8 illustrates an example of a method 180 for constructing a tunable transmon qubit. At 182, a transmon qubit is fabricated. For example, the transmon qubit can be fabricated via known methods for fabricating superconducting circuits. In one example, the transmon qubit comprises at least a first Josephson junction on a first path between a transmission line and a circuit ground, second and third Josephson junctions arranged in parallel with one another on a second path between the transmission line and the circuit ground to form a direct current superconducting quantum interference device (DC SQUID) in parallel with the first Josephson junction, and a capacitor in parallel with the first Josephson junction and the DC SQUID on a third path between the transmission line and the circuit ground as to form, in combination with the first path, an outer loop of the transmon qubit. It will be appreciated that the transmon qubit can include, for example, multiple Josephson junctions on the first path to use a three-junction configuration. At 184, a frequency curve of the transmon qubit is determined. For example, spectroscopic measurements of the first energy level transition frequency can be made at each of a plurality of control fluxes for the qubit, and an appropriate cure fitting algorithm can be applied to this data to provide the frequency curve.

At 186, a constant bias flux is provided to one of the DC SQUID and the outer loop of the transmon qubit to adjust a frequency curve of the transmon qubit, where the frequency curve represents a frequency of a first energy level transition as a function of a control flux. In one implementation, a constant bias flux to the outer loop as to translate the frequency curve, such that a substantially constant value is added or subtracted from the frequency of a first energy level transition across a range of control fluxes. This can be done by adding the constant bias flux to a control flux provided to the transmon qubit, or independently of the control flux provided to the transmon qubit. In another implementation, a constant bias flux is provided to the DC SQUID as to alter a peak-to-peak distance of the frequency curve. It will be appreciated, however, that these implementations are not exclusive, and that bias fluxes can be provided to each of the outer loop and the DC SQUID.

Figure 9:
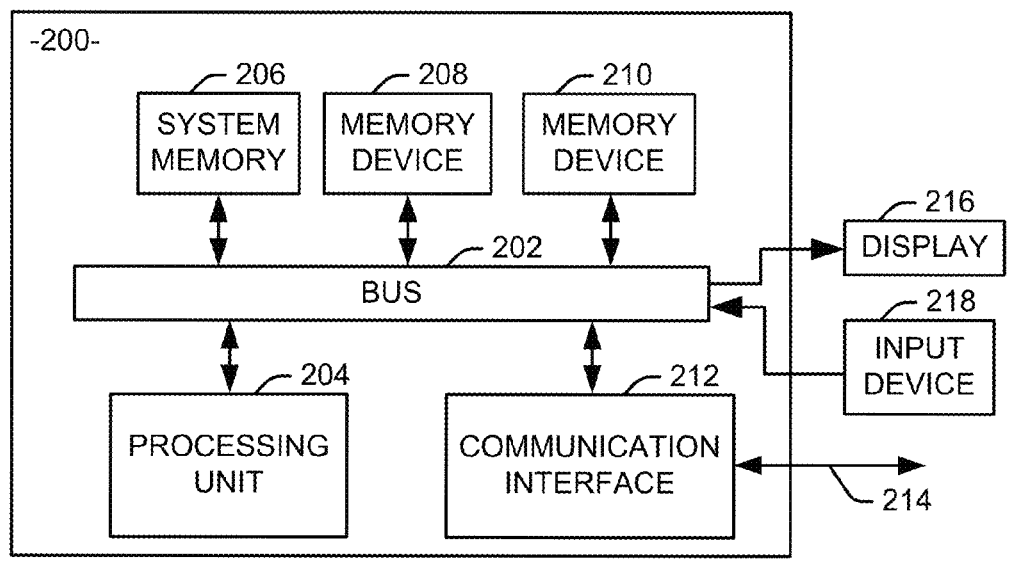
FIG. 9 is a schematic block diagram illustrating an exemplary system of hardware components capable of implementing examples of the systems and methods disclosed in FIGS. 1-8.

FIG. 9 is a schematic block diagram illustrating an exemplary system 200 of hardware components capable of implementing examples of the systems and methods disclosed in FIGS. 1-8, such as the system control 126 of FIG. 6. The system 200 can include various systems and subsystems. The system 200 can be a personal computer, a laptop computer, a workstation, a computer system, an appliance, an application-specific integrated circuit (ASIC), a server, a server blade center, a server farm, etc.

The system 200 can includes a system bus 202, a processing unit 204, a system memory 206, memory devices 208 and 210, a communication interface 212 (e.g., a network interface), a communication link 214, a display 216 (e.g., a video screen), and an input device 218 (e.g., a keyboard and/or a mouse). The system bus 202 can be in communication with the processing unit 204 and the system memory 206. The additional memory devices 208 and 210, such as a hard disk drive, server, stand-alone database, or other non-volatile memory, can also be in communication with the system bus 202. The system bus 202 interconnects the processing unit 204, the memory devices 206-210, the communication interface 212, the display 216, and the input device 218. In some examples, the system bus 202 also interconnects an additional port (not shown), such as a universal serial bus (USB) port.

The processing unit 204 can be a computing device and can include an application-specific integrated circuit (ASIC). The processing unit 204 executes a set of instructions to implement the operations of examples disclosed herein. The processing unit can include a processing core.

The additional memory devices 206, 208 and 210 can store data, programs, instructions, database queries in text or compiled form, and any other information that can be needed to operate a computer. The memories 206, 208 and 210 can be implemented as computer-readable media (integrated or removable) such as a memory card, disk drive, compact disk (CD), or server accessible over a network. In certain examples, the memories 206, 208 and 210 can comprise text, images, video, and/or audio, portions of which can be available in formats comprehensible to human beings.

Additionally or alternatively, the system 200 can access an external data source or query source through the communication interface 212, which can communicate with the system bus 202 and the communication link 214.

In operation, the system 200 can be used to implement one or more parts of a navigation system in accordance with the present invention. Computer executable logic for implementing the system control 126 resides on one or more of the system memory 206, and the memory devices 208, 210 in accordance with certain examples. The processing unit 204 executes one or more computer executable instructions originating from the system memory 206 and the memory devices 208 and 210. The term "computer readable medium" as used herein refers to a medium that participates in providing instructions to the processing unit 204 for execution, and can include either a single medium or multiple non-transitory media operatively connected to the processing unit 204.

The invention has been disclosed illustratively. Accordingly, the terminology employed throughout the disclosure should be read in an exemplary rather than a limiting manner. Although minor modifications of the invention will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

Having described the invention, we claim:

1. A tunable transmon qubit comprising:
    a first Josephson junction on a first path between a transmission line and a circuit ground;
    second and third Josephson junctions arranged in parallel with one another on a second path between the transmission line and the circuit ground to form a direct current superconducting quantum interference device (DC SQUID), the DC SQUID being in parallel with the first Josephson junction;
    a capacitor in parallel with the first Josephson junction and the DC SQUID on a third path between the transmission line and the circuit ground as to form, in combination with the first path, an outer loop of the tunable transmon qubit; and
    a bias circuit configured during an operation of the tunable transmon qubit to provide a first constant bias flux to one of the DC SQUID and the outer loop of the tunable transmon qubit and to provide a second constant bias flux to another of the DC SQUID and the outer loop of the tunable transmon qubit.

2. The tunable transmon qubit of claim 1, wherein the bias circuit is configured to provide the first constant bias flux to the DC SQUID.

3. The tunable transmon qubit of claim 1, wherein the bias circuit is configured to provide the first constant bias flux the outer loop of the tunable transmon qubit.

4. The tunable transmon qubit of claim 1, wherein the bias circuit is a first bias circuit configured to provide the first constant bias flux to the one of the DC SQUID and the outer loop of the tunable transmon qubit, the system further comprising a second bias circuit configured to provide the second constant bias flux to another of the DC SQUID and the outer loop of the tunable transmon qubit.

5. The tunable transmon qubit of claim 4, the DC SQUID comprising at least one inductor, such that a bias current within the DC SQUID can be induced in response to the first constant bias flux, such that a frequency of a transition between a ground state of the qubit and a first excited state of the qubit is a function of the provided first constant bias flux.

6. The tunable transmon qubit of claim 5, the outer loop comprising at least one inductor, such that a bias current can be induced in the outer loop in response to the second constant bias flux, such that a frequency of a transition between a ground state of the qubit and a first excited state of the qubit is a function of both of the first constant bias flux and the second constant bias flux.

7. The tunable transmon qubit of claim 4, the outer loop comprising at least one inductor, such that a bias current can be induced in the outer loop in response to the second constant bias flux, such that a frequency of a transition between a ground state of the qubit and a first excited state of the qubit is a function of the provided second constant bias flux.

8. The tunable transmon qubit of claim 1, further comprising a fourth Josephson junction arranged in series with the first Josephson junction on the first path.

9. A system comprising:
    the tunable transmon qubit of claim 1; and
    a classical control configured to provide a control flux to the tunable transmon qubit.

10. The system of claim 9, further comprising a transmission line resonator coupled to the tunable transmon qubit.

11. The system of claim 9, wherein the classical control comprises a reciprocal quantum logic (RQL) driver providing current to a current loop inductively coupled to the tunable transmon qubit.

12. The system of claim 11, wherein the bias circuit is configured to provide current to a current loop inductively coupled to the tunable transmon qubit.

13. A system comprising:
    a plurality of tunable transmon qubits, wherein a given transmon qubit of the plurality of tunable transmon qubits comprises:
        a first Josephson junction on a first path between a transmission line and a circuit ground;
        second and third Josephson junctions arranged in parallel with one another on a second path between the transmission line and the circuit ground to form a direct current superconducting quantum interference device (DC SQUID), the DC SQUID being in parallel with the first Josephson junction;
        a capacitor in parallel with the first Josephson junction and the DC SQUID on a third path between the transmission line and the circuit ground as to form, in combination with the first path, an outer loop of the tunable transmon qubit; and
        a bias circuit configured to provide a constant bias flux to one of the DC SQUID and the outer loop of the tunable transmon qubit; and
    a classical control associated with each of the plurality of tunable transmon qubits and coupled to a digital-to-analog converter (DAC) to receive a control signal, each classical control comprising a respective a reciprocal quantum logic (RQL) driver that provides current to a current loop inductively coupled to a respective tunable transmon qubit to deliver a control flux to the respective tunable transmon qubit in response to the control signal from the DAC.

14. The system of claim 9, further comprising a system control operatively connected to the classical control, the system control being operative to control respective magnitudes of the control flux to transition the tunable transmon qubit among energy states associated with the qubit.

15. A method for constructing a tunable transmon qubit, the method comprising:
    fabricating a transmon qubit comprising a first Josephson junction on a first path between a transmission line and a circuit ground, second and third Josephson junctions arranged in parallel with one another on a second path between the transmission line and the circuit ground to form a direct current superconducting quantum interference device (DC SQUID) in parallel with the first Josephson junction, and a capacitor in parallel with first Josephson junction and the DC SQUID on a third path between the transmission line and the circuit ground as to form, in combination with the first path, an outer loop of the transmon qubit;

determining a frequency curve of the transmon qubit; and providing during operation of the tunable transmon qubit a first constant bias flux to one of the DC SQUID and the outer loop of the transmon qubit and a second constant bias flux to another of the DC SQUID and the outer loop of the transmon qubit to adjust the frequency curve of the transmon qubit, the frequency curve representing a frequency of a first energy level transition as a function of a control flux.

16. The method of claim 15, wherein during operation of the tunable transmon qubit a first constant bias flux to one of the DC SQUID and the outer loop of the transmon qubit and a second constant bias flux to another of the DC SQUID and the outer loop of the transmon qubit to adjust the frequency curve of the transmon qubit comprises providing the first constant bias flux to the outer loop as to translate the frequency curve, such that a substantially constant value is added or subtracted from the frequency of a first energy level transition across a range of control fluxes.

17. The method of claim 16, wherein providing the first constant bias flux to the outer loop comprises adding the constant bias flux to a control flux provided to the transmon qubit.

18. The method of claim 16, wherein providing the first constant bias flux to the outer loop comprises providing the first constant bias flux independently of a control flux provided to the transmon qubit.

19. The method of claim 15, wherein during an operation of the tunable transmon qubit a first constant bias flux to one of the DC SQUID and the outer loop of the transmon qubit and a second constant bias flux to another of the DC SQUID and the outer loop of the transmon qubit to adjust the frequency curve of the transmon qubit comprises providing the first constant bias flux to the DC SQUID as to alter a peak-to-peak distance of the frequency curve.

* * * * *